United States Patent [19]

Lemelson

[11] Patent Number: 5,067,826
[45] Date of Patent: * Nov. 26, 1991

[54] BALL AND ROLLER BEARINGS AND BEARING COMPONENTS

[76] Inventor: Jerome H. Lemelson, 48 Parkside Dr., Princeton, N.J. 08540

[*] Notice: The portion of the term of this patent subsequent to Oct. 2, 2007 has been disclaimed.

[21] Appl. No.: 489,664

[22] Filed: Mar. 7, 1990

Related U.S. Application Data

[63] Continuation-in-part of Ser. No. 32,352, Mar. 31, 1987, Pat. No. 4,960,643.

[51] Int. Cl.$^5$ ............................ F16C 33/32; F16C 33/34
[52] U.S. Cl. ........................................ 384/492; 384/565; 384/907.1; 384/913
[58] Field of Search ............... 384/297, 492, 565, 569, 384/913, 907.1, 907, 912, 913; 252/29; 423/446

[56] References Cited

U.S. PATENT DOCUMENTS

| | | | |
|---|---|---|---|
| 3,641,990 | 2/1972 | Kinnersly | 384/907 |
| 4,789,251 | 12/1988 | McPherson et al. | 384/907.1 |
| 4,797,009 | 1/1989 | Yamazuki | 384/907.1 |

FOREIGN PATENT DOCUMENTS

| | | | |
|---|---|---|---|
| 2926080 | 1/1981 | Fed. Rep. of Germany | 252/29 |
| 195094 | 10/1985 | Japan | 423/446 |

Primary Examiner—Lenard A. Footland
Attorney, Agent, or Firm—Neil F. Markva

[57] ABSTRACT

Improved structures in bearings operable to receive and support shafts or members which are supported for rotation on shafts or pins. The balls and/or rollers and-/or one or more of such components, such as the outer and inner races, are coated with hard, high strength synthetic diamond material deposited in situ thereon. In all forms, the synthetic diamond material coatings may be overcoated with thin layers of chromium, chromium alloys or similar materials which serve to protect the synthetic diamond material coating same.

7 Claims, 1 Drawing Sheet

BALL AND ROLLER BEARINGS AND BEARING COMPONENTS

RELATED APPLICATIONS

This is a continuation-in-part of application Ser. No. 032,352 filed Mar. 31, 1987 now U.S. Pat. No. 4,960,643.

SUMMARY OF THE INVENTION

This invention relates to improvements in the structures of bearings employed to support shafts in rotation or assemblies for rotation about shafts and the like. While the invention is primarily directed to improvements in the structures of so-called ball and roller bearings, it is also directed to conventional cylindrically shaped bearing structures which do not contain a plurality of components such as balls or rollers.

Conventional bearings, such as ball and roller bearings, bushings and the like, are not only subject to wear, such as frictional wear when the surfaces of bearing components and shafts engage during use, but also to failure resulting from the expansion or extension of surface irregularities, such as cracks and pits, created, for example, during the manufacture of such bearings and bearing components. Conventional machining, sintering, pressing, stamping, molding and other forming operations employed to form bearings and bearing components results in surface formations thereof which contain microirregularities such as surface cracks and the like which may be expanded during use as a result of frictional wear and impact forces applied to the surfaces containing such irregularities.

The instant invention employs intense radiation directed at the surfaces of bearings and bearing components in the presence of a fluid, such as methane gas, containing carbon atoms which are caused by the intense radiation to deposit as a thin film of synthetic diamond material against the surface against which the radiation is directed.

In one form of the instant invention, the carbon film fills in the tiny surface irregularities or cracks and forms a layer varying from a few millionths of an inch to a thousandth of an inch or more thick on the surface to which it is coated. The layer of synthetic diamond material serves a number of functions including protection against attrition and wear, protection against chemical corrosion and the effects of frictional heat. In a particular form of the invention, the radiation is sufficient to heat and reduce or melt the thin outer stratum of the surface being coated with the diamond film so as to reduce the size of or eliminate the cracks formed therein during the fabrication of the bearing.

In a preferred modified form of the invention, after a thin layer of synthetic diamond film is formed on the surface of a bearing or bearing component, it is overcoated with a thin layer of a wear resistant dry lubricating material, such as hard chromium, chromium alloy or other suitable hard surfacing material. Such outer layer serves to protect the outer surface of the diamond coating on which it is disposed, from abrasive effects of abrasive elements provided in a lubricating material and the effect of surface wear during contact with adjacent shaft or bearing surfaces.

Accordingly it is a primary object of this invention to provide new and improved structures in bearings utilized in rotational mechanical assemblies.

Another object is to provide improvements in the structures of ball bearings.

Another object is to provide improvements in the structures of roller bearings.

Another object is to provide improvements in the structures of balls employed in ball bearings.

Another object is to provide improvements in the structures of rollers employed in roller bearings assemblies.

Another object is to provide improvements in the structures of races employed in ball or roller bearings.

Another object is to provide improvements in the structures of cages employed in ball or roller bearing assemblies.

Another object is to provide improved ball and roller bearing assemblies containing multiple components which contact each other, the contacting surfaces of which components are coated with thin hard synthetic diamond films.

Another object is to provide improved ball and roller bearing assemblies containing multiple components which contact each other, the contacting surfaces of which components are coated with thin hard synthetic diamond films which are overcoated with lubricating protective coatings such as chromium, chromium alloys and the like.

With the above and such other objects in view as may hereinafter more fully appear, the invention consists of the novel structures, article constructions and methods described in the following specification and illustrated in the drawings, but it is to be understood that variations and modifications may be resorted to which fall within the scope of the invention as claimed without departing from the nature and spirit of the invention.

BRIEF DESCRIPTION OF THE DRAWINGS

Other objects of this invention will appear in the following description and appended claims, reference being made to the accompanying drawings forming a part of the specification wherein like reference characters designate corresponding parts in the several views.

DETAILED DESCRIPTION

Figure 1:
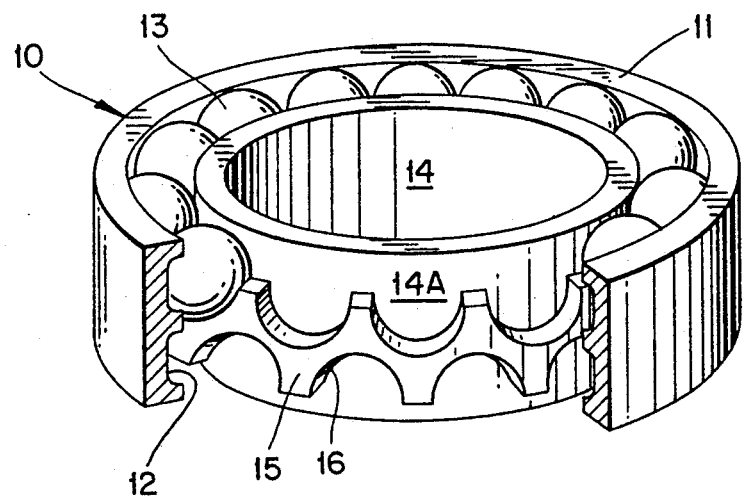
FIG. 1 is a fragmentary perspective view of a ball bearing assembly of this invention.

FIG. 1 shows details of a ball bearing, generally designated 10, formed of an assembly of hard load supporting balls 13 preferably formed of metal such as steel and supported in circular array between a cylindrically shaped steel outer race 11 and a steel inner race 14. A cage 15 also made of steel, such as stainless steel, is also supported between the two races to retain the balls spaced apart from each other in two circular arrays as shown. The balls 13, have the same diameters and may be formed of other suitable metal or hard ceramic and effect rolling movement when a machine element secured to the outer race 11 effects rotation about a shaft secured to the inner race 14 or vice versa.

Coating the entire outer surfaces of the balls 13 and either the entire outer surfaces of the races 11 and 14 and cage 15 or just the surfaces thereof which make contact with the balls 13, is a hard synthetic diamond material 17 formed in situ on such components by the deposition of carbon atoms from a carbon atom containing material such as methane gas mixed with hydrogen when such gas mixture and the article therein are subject to intense radiation such as suitable microwave radiation which is beamed at the surface or surfaces being coated. Such synthetic diamond material coats the balls 13, the outer race 11 or the inner surfaces of the illustrated ball engaging channels 12 formed therein, the cage 15 or just the semi-cylindrical surfaces 16 thereof which engage the balls and the inner race 14 or just the outer cylindrical surface thereof.

The depth or thickness of such synthetic diamond coating may vary from several millions of an inch to a thousandth of an inch or more depending on the size of the bearing, loading expected thereon during use, temperature of operation and impact forces which may be applied thereto. Large ball bearings may require synthetic diamond coatings in the range of 0.001" to 0.010" or more. Overcoating such synthetic diamond layer is a layer of a hard solid lubricating material such as chromium of the same or greater thickness than the hard carbon coating which serves to protect the synthetic diamond coating from erosion due to rolling friction.

The combination of the synthetic diamond coating and its overcoating of chromium serve to substantially enhance the wear resistance and life of the components coated therewith, particularly in preventing microcavities or cracks which normally are formed in the outer stratum of the machined elements, from expanding and eventually resulting in the destruction of the component or in rendering it inefficient in operation.

Depending on the thicknesses of the synthetic diamond layer and chromium overcoating layer, either or both such coatings may serve to enhance the strength of the component to which they are applied and to absorb a substantial amount of the load and impact forces applied during operation of the bearing. While the primary function of the synthetic diamond coating is to protect the component from experiencing failure of the surface stratum of the base material thereof by distributing impact and load forces applied thereto and preventing the formation and/or extension of surface defects such as small cracks and occlusions, it also serves to resist deformation in shape of the balls, the inner and outer races and, if applied, the cage. Frictional wear of the semi-cylindrical surfaces of the side walls of the cage ball retaining portions will also be greatly reduced, particularly if the synthetic diamond coating is overcoated with chromium.

Figure 2:
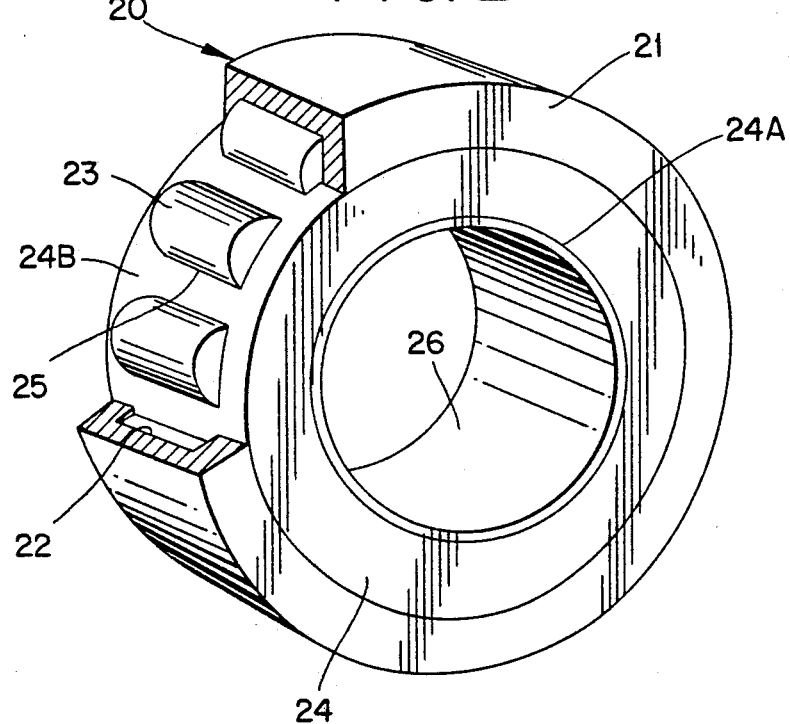
FIG. 2 is a fragmentary perspective of a roller bearing assembly according to the invention.

FIG. 2 shows a roller bearing generally designated 20, formed of an assembly of an outer race 21, and an inner race 24 having a plurality of semi-cylindrical cavities 25 formed therein with the outer race containing a channel 22 configured to accommodate a plurality of cylindrical bearing rollers 23 slidably or rollably supported within the cavities 25. A cylindrical bearing sleeve 26 is secured within the inside bore 24A of the inner race 24.

The rollers 23 are coated with a synthetic diamond material layer completely surrounding each roller 23 and formed in situ thereon by the deposition and consolidation of carbon atoms stripped from molecules of carbon atom containing gas, such as methane subjected to a beam or beams of high intensity microwave radiation or the like. Such thin coating of synthetic diamond material is also applied to the semi-cylindrical surfaces of the recesses 25 in the inner race 24 and the wall surfaces of channel 22 formed in the outer race 21.

Notation

In addition to the synthetic diamond material coating the outer surfaces of the rollers 23 and channel 22 in the outer race, the synthetic diamond material coats the semi-cylindrical surfaces of recesses 25 in the outer surface of inner race 24. Such synthetic diamond material may also extend completely around all of the surfaces of the outer race 21 and the cylindrical outer surface 24B of the inner race 24 as well as the side walls of such races and the outer and inner walls of the outer and inner races.

Such synthetic diamond material may coat the inside surface of sleeve 26. However, if a friction fit is required between such inner surface and a shaft supporting the assembly 20, such synthetic diamond material may be eliminated from sleeve 26.

A thin layer of chromium extends across all or selected portions of the synthetic diamond surfaces to protect same against rolling or sliding frictional wear, scouring, chemical corrosion and erosion.

In the bearing structures 10 and 20 illustrated in FIGS. 1 and 2, select portions of the various bearing components may be coated with synthetic diamond and chromium layers, rather than the whole outer surfaces thereof. For example, just the balls 13 and the rollers 23 may be so coated and overcoated; the outer surface 14A of the inner race 14 against which the balls 13 roll and/or the inner surfaces of channels 12 formed in the outer race 11. Similar composite coatings may be applied to the outer surfaces of the rollers 23, the walls of the semi-cylindrical cavities 25 in inner race 24, the outer surface 24B of inner race 24 or any other surfaces subjected to rolling or sliding wear, chemical attack, surface erosion or failure caused the extension of cavities or microcracks formed during machining same to shape.

The inner race 14 or sleeve 26 may also serve as a bearing per se, made of suitable metal or high strength ceramic material and having the inside surface thereof coated with synthetic diamond material as described for retaining and supporting or being supported by a cylindrical shaft forming part of a machine assembly such as a power driven or drivable member of assembly. As set forth above, such synthetic diamond coating may cover just the cylindrical inside surface of such bearing or the entire bearing and the portion of such synthetic diamond coating which is aligned with such shaft may be coated with one of the metals described above, such as chromium, to lubricate and protect the surface of the diamond material coating such shaft. While the shaft may be the shaft of a motor or motor driven assembly, such bearing may support or be supported by another machine element, pillow blocks or assembly for supporting the shaft as it rotates on such shaft.

Figure 3:
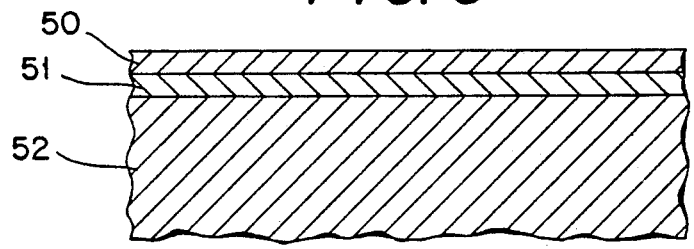
FIG. 3 is a fragmentary sectional view of the composite structure used to form the bearing assemblies of the invention.

FIG. 3 shows structural details of the synthetic diamond coatings, the protective overcoatings and the substrates coated. The substrate 52, which may be any of the configurations hereinabove described, is made of suitable metal, metal alloy, cermet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 50 of chromium is shown completely covering the synthetic diamond coating 51 and may be applied by electroless or electrical deposition, vapor deposition, detonation or plasma plating. Thickness of depths of such overcoating may range from 0.00001 to several thousands of an inch or more and preferably in the range of a few thousands of an inch or less.

The coatings of synthetic hard diamond or diamond-like material may be applied to the entire articles or select portions of such articles subjected to frictional wear, weathering, temperature or chemical corrosive effects, and destruction caused by the expansion of surface defects such as surface cracks formed during fabrication. The coating may be formed of carbon atoms deposited thereon from gas, vapor or liquid molecules containing such carbon atoms, as a result of passing high intensity radiation, such as microwave radiation or the like, through such carbon atom containing fluids, by means shown and described in my parent application Ser. No. 032,307, now U.S. Pat. No. 4,859,493. The coatings may vary in thicknesses from a few millionths of an inch to a thousandth of an inch or more depending on the expected use of the articles or assemblies including the corrosive and erosive atmosphere to which they are subjected. Thicker films in the range of 0.0001" to 0.001" or more may be provided to substantially enhance the tensile and compressive strengths of the articles or components. A where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

Certain modifications to the structures and methods for making same may be found in my parent application Ser. No. 032,307, now U.S. Pat. No. 4,859,493 and in pending patent application Ser. No. 032,352 filed Mar. 31, 1987, reference being made directly thereto as part of the instant disclosure. Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer suface or surfaces of the articles to the exclusion of another area or areas thereof for functional and/or economic purposes. Such an electon beam or laser beam may be employed in combination with microwave radiation and passed through a carbon atom containing gas, such as methane, surrounding all or part of the article or assembly to be coated, and employed to effect or increase the rate of deposition of carbon atoms to form the synthetic diamond coating and/or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with protective coatings of chromium, alloys containing chromium, metal alloys containing such metal atoms as vanadium, tungsten, titanium, molybdenum and/or such metals per se, which serve to protect and/or lubricate the surface of the synthetic diamond coatings to resist frictional wear and abrasion during operation and use of the coated article. In certain applications, the synthetic diamond coating will serve to electrically insulate the article. In others, it will protect the surface coated therewith from heat and/or chemical corrosion. In others, the surface(s) coatings will impart greater resistance to wear and abrasion. Surface attrition due to impact forces and loading during use may also be lessened or eliminated by such hard synthetic diamond coatings(s) which may be applied as a single or plurality of layers per se or combined or overcoated with one or more layers of the described metals and/or metal alloys to lubicate and protect the surface of the synthetic diamond coating.

4. Coatings formed of a plurality of layers of synthetic diamond material formed as described between respective layers of the same or different metals, metal alloys and/or ceramic materials may be employed to enhance the physical, chemical resistance and electrical characteristics of the articles described. Such multiple coatings may also be employed to substantially enhance the strength and stiffness of the articles.

5. Certain of the articles of manufacture described above may be fabricated by compressing particles of metal, various ceramic materials or mixtures of either or both materials with fine particles of synthetic diamond produced, for example, as set forth in my U.S. Pat. No. 4,859,493 and employed to strengthen the composite. Short filaments of synthetic diamond or composites thereof sa set forth in such patent may also be mixed with such particulate material(s) to form articles of the type(s) described herein having superior substrate strength and corrosion resistence. Compression of such mixture(s) between dies with or without the addition of a resin binder while simultaneous and/or sequentially heating same to effect sintering or otherwise consolidating the metal particles into a defined shape may be effected prior to the described coating with synthetic diamond material.

6. The described articles may also be formed by compressing particulate material with resinous binder particles, then sintering at a temperature to burn away the resin leaving a porous substrate of desired shape. By placing such porous substrate in a chamber containing a mixture of hydrocarbon gas and hydrogen under pressure, molecules of the gas mixture will flow into the pores or intersticies of such substrate, particularly if the chamber and substrate therein are first subjected to suitable vacuum. Thereafter, by generating and directing suitable microwave energy through the gas and substrate, carbon atoms will be stripped from the gas molecules containing same and will form as synthetic diamond or diamond-like material on the surfaces of the walls of the internal interstices, thus providing a new high strength structure of select external shape which is internally reinforced with synthetic diamond material and is externally coated with such material providing a hard outer shell which is highly resistant to erosion, surface attrition, wear and chemical corrosion.

7. The term synthetic diamond material employed herein refers to high strength coatings, filaments or particles of carbon exhibiting the chemical and physical characterics (e.g. strength) of diamond. For certain of the articles and applications described above, the carbon atoms stripped from the molecules of hydrocarbon gas, such as methane, by microwave energy may form hard high strength coatings which do not quite exhibit the hardness of diamond but will suffice for many applications.

What is claimed is:

1. A roller for use in roller bearings, said roller comprising:
   a) a shaped roller substrate formed of a hard material and having a longitudinal outer surface of revolution,
   b) said surface of revolution of said roller being entirely coated with means defining a hard synthetic diamond-like material deposited in situ thereon in a thickness sufficient to protect said surface from frictional wear during the operation of said roller,
   c) said synthetic diamond-like material is deposited on said substrate to a thickness sufficient to protect the surface stratum of said roller from developing surface occlusions such as surface cracks and from the spread of surface defects due to impact loads applied to said roller during the operation of the roller bearing in which said roller is used.

2. A roller in accordance with claim 1 wherein said longitudinal outer surface of revolution of said roller is substantially cylindrical in shape.

3. A roller in accordance with claim 1 wherein said solid lubricating material is a metal, metal alloy, or nitride, carbide, oxide defined by a metal selected from the group consisting of chromium, vanadium, titanium, molybdenum, aluminum and mixtures thereof.

4. A roller in accordance with claim 1 wherein a layer of protecting material is contiguously disposed on the diamond-like material and selected from the group consisting of metal, metal alloy, oxide, nitride and carbide each defined at least in part by chromium, vanadium, titanium, tungsten and aluminum.

5. A roller in accordance with claim 1 wherein a layer of protecting material is contiguously disposed on the diamond-like material, and said layer of protecting material is chromium.

6. A ball for ball bearings and the like, said ball comprising:
   a) a spherically shaped substrate having an outer spherical surface and being formed of a hard material,
   b) a layer of synthetic diamond-like material contiguously disposed on the outer spherical surface of said spherical substrate,
   c) a further layer of solid dry lubricating material contiguously disposed on said synthetic diamond-like material, and
   d) said solid dry lubricating material layer is a chromium layer that is less than 0.001" thick.

7. A ball in accordance with claim 6 wherein said synthetic diamond-like material is applied in a thickness in the range of 0.0001" to 0.001".

* * * * *